United States Patent [19]

Emerick et al.

[11] Patent Number: 5,050,296
[45] Date of Patent: Sep. 24, 1991

[54] AFFIXING PLUGGABLE PINS TO A CERAMIC SUBSTRATE

[75] Inventors: Alan J. Emerick, Warren Center, Pa.; Eugene L. Marsh, Endicott, N.Y.; Thomas L. Miller, Vestal, N.Y.; Jerzy M. Zalesinski, Endicott, N.Y.

[73] Assignee: International Business Machines Corporation, Armonk, N.Y.

[21] Appl. No.: 534,891

[22] Filed: Jun. 7, 1990

[51] Int. Cl.⁵ .............................................. H01R 9/14
[52] U.S. Cl. ....................................... 29/845; 29/739; 29/512; 10/26
[58] Field of Search ...................... 10/26; 29/512, 845, 29/739, 842, 843

[56] References Cited

U.S. PATENT DOCUMENTS

| | | |
|---|---|---|
| 980,420 | 1/1911 | Hulfish ................................. 10/27 R |
| 1,914,651 | 6/1933 | Reutter . |
| 1,936,404 | 11/1933 | Miner ................................... 173/361 |
| 2,292,863 | 8/1942 | Beggs .................................. 250/87.5 |
| 2,456,118 | 12/1948 | Foster ................................... 29/512 |
| 2,846,659 | 8/1958 | Hinspater et al. . |
| 2,990,533 | 6/1961 | Hughes et al. . |
| 3,093,887 | 6/1963 | Prestige et al. . |
| 3,202,755 | 8/1965 | Oswald . |
| 3,211,875 | 10/1965 | Bengtsson ........................... 200/166 |
| 3,216,097 | 11/1965 | Stricker et al. . |
| 3,257,708 | 6/1966 | Stricker et al. . |
| 3,484,937 | 12/1969 | Cambell, Jr. et al. . |
| 3,489,879 | 1/1970 | Salzer ................................... 219/152 |
| 3,494,029 | 2/1970 | Theilgaard . |
| 3,529,120 | 9/1970 | Andrasfay ........................... 219/107 |
| 3,601,750 | 8/1971 | Mancini . |
| 3,670,294 | 6/1972 | Johnson et al. . |
| 3,735,466 | 5/1973 | Jensen . |
| 3,768,134 | 10/1973 | Reda et al. . |
| 4,082,394 | 4/1978 | Gedney et al. . |
| 4,092,697 | 5/1978 | Spaicht ................................ 361/386 |
| 4,110,904 | 9/1978 | Johnson . |
| 4,136,259 | 1/1979 | Djeddah ............................ 174/152 S |
| 4,415,113 | 11/1983 | Houser et al. ...................... 227/130 |
| 4,550,493 | 11/1985 | Darrow et al. ................... 29/845 X |
| 4,598,470 | 7/1986 | Dougherty, Jr. et al. ............ 29/837 |
| 4,631,821 | 12/1986 | Houser ................................. 29/845 |
| 4,644,643 | 2/1987 | Sudo ..................................... 29/845 |
| 4,741,100 | 5/1988 | Pierson ................................ 29/845 |
| 4,753,602 | 6/1988 | Peyrat et al. ......................... 439/78 |
| 4,861,944 | 8/1989 | Jones, II et al. ..................... 29/842 |

FOREIGN PATENT DOCUMENTS 247445 10/1963 Australia .
891180 1/1972 Canada .

OTHER PUBLICATIONS

"Terminal Pin Projector"—H. P. Byrnes, IBM TDB, vol. 9, No. 4 09/66 p. 365.
"Pinning Technique For Ceramic Module"—J. R. Lynch, IBM TDB, vol. 14, No. 1, 06/71, pp. 174–175.
"Brazing Contact Pins To Ceramic Substrates", —B. Martin et al., IBM TDB, vol. 14, No. 9, 02/72, p. 2594.
"Low-Stress Pin Insertion"—R. J. Modlo et al., IBM TDB vol. 22, No. 8B, 01/80, pp. 3649–3650.
"Swaged Hollow Electrical Inlet Pin", IBM TDB, vol. 29, N. 2, 07/86 pp. 639–640.

*Primary Examiner*—Carl E. Hall
*Assistant Examiner*—Carl J. Arbes
*Attorney, Agent, or Firm*—Norman R. Bardales; David L. Adour; Shelly M. Beckstrand

[57] ABSTRACT

A method for affixing pins to a ceramic substrate substantially eliminating cracking of the substrate by pre-bulging the pin blanks and, then after inserting the pin blanks into the substrate, a clearance is provided between the lower pin holding die and the lower face of the substrate for the subsequent head forming operation on the opposite face of the substrate.

7 Claims, 2 Drawing Sheets

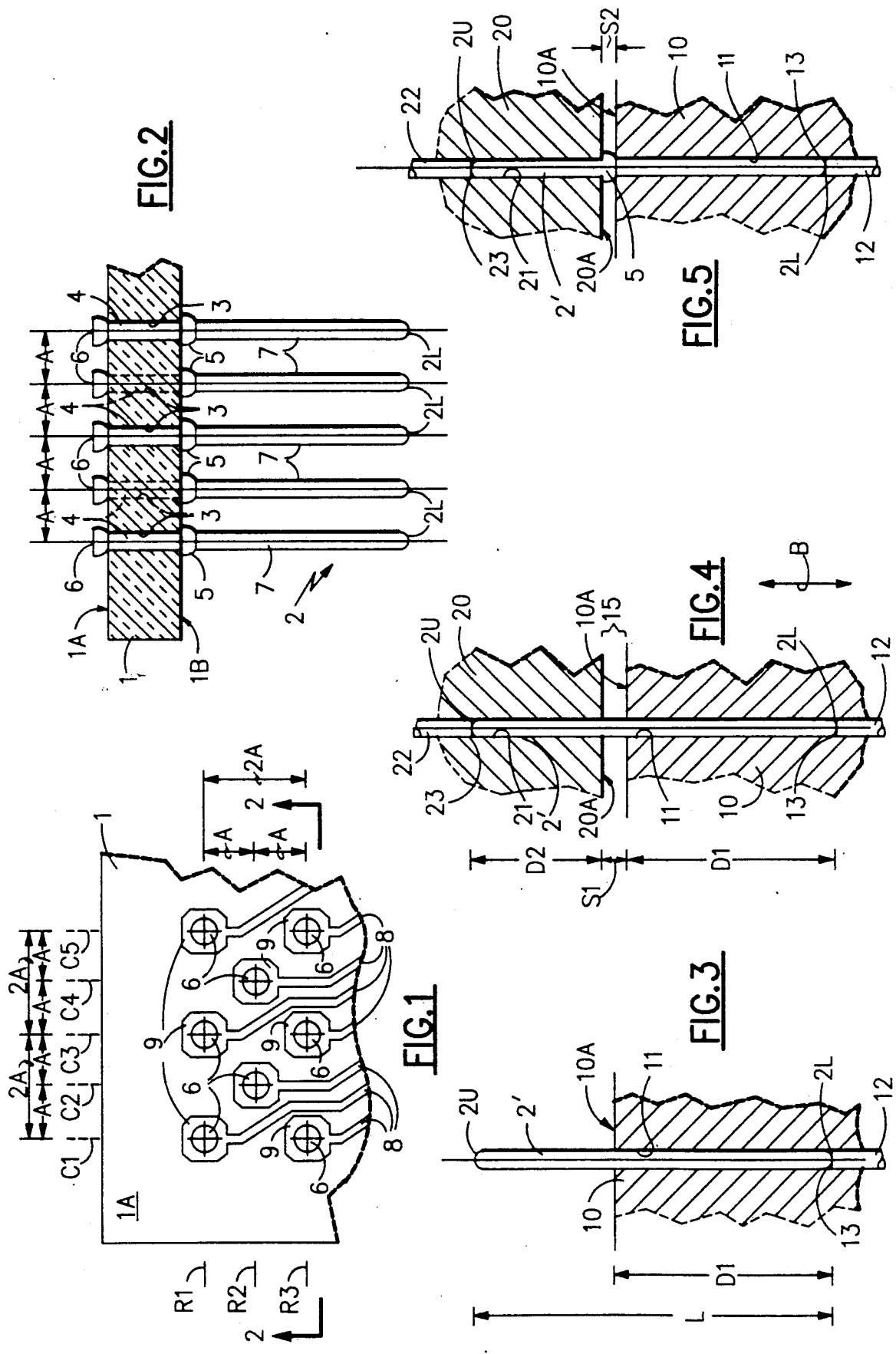

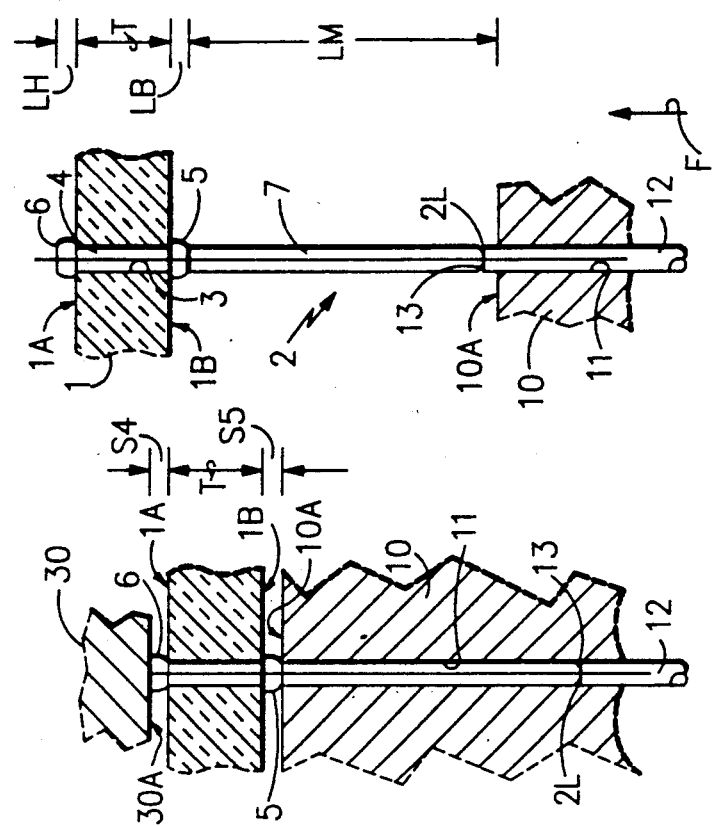

AFFIXING PLUGGABLE PINS TO A CERAMIC SUBSTRATE

BACKGROUND OF THE INVENTION

1. Field of the Invention

This invention relates to affixing pins to a ceramic substrate and more particularly to affixing pluggable pins to a ceramic substrate for use in pluggable electronic circuit package assemblies.

2. Description of the Prior Art

In the electrical arts, it is well known to affix electrical conductive pins to an insulative base member.

U.S. Pat. Nos. 1,914,651, 1,936,404, 2,292,863, 3,211,875, 3,670,294 and 4,753,602, and the publication entitled "Swaged Hollow Electrical Inlet Pin", IBM Technical Disclosure Bulletin Vol. 29 No. 2, July 1986, pp 639-640, are examples of pluggable pins affixed to an insulating base for electrical devices such as radio or vacuum tubes and electrical wire connectors. U.S. Pat. No. 4,136,259, discloses an igniting electrode for a burner in which an insulating ceramic body houses an electrically conducting metal stem.

U.S. Pat. Nos. 2,846,659, 2,990,533, 3,093,887, 3,202,755, 3,484,937, 3,494,029, and 3,601,750, Australian Patent, No. 247,745 (published 29 November, 1962), Canadian Patent, No. 891180, (issued Jan. 18, 1972), and the publication entitled "Terminal Pin Projector"—H. P. Byrnes, IBM Technical Disclosure Bulletin, Vol. 9, No. 4, September 1966, p 365, are examples of pluggable and/or non-pluggable type pins affixed to non-ceramic substrates and more particularly affixed to printed circuit boards.

U.S. Pat. Nos. 3,216,097 3,257,708, 3,489,879, 3,529,120, 3,735,466, 3,768,134, 4,082,394, 4,092,697, 4,110,904, 4,415,113, 4,598,470, and 4,631,821, and the publications entitled "Pinning Technique For Ceramic Module"—J. R. Lynch, "Brazing Contact Pins To Ceramic Substrates"—B. Martin et al, and "Low-stress Pin Insertion"—R. J. Modlo et al, IBM Technical Disclosure Bulletin,. Vol. 14, No. 1, June 1971, pp 174-175, Vol. 14, No. 9, February 1972, p 2594, and Vol. 22, No. 8B, January 1980, pp 3649-3650, are examples of of pluggable pins affixed to ceramic substrates.

In the aforementioned Patents, Nos. 1,914,651 and 1,936,404, hollow pin type contact members are affixed to a base member of porcelain, bakelite, glass or other similar material. The resultant sub-assembly is used as a component for radio or vacuum tubes. In No. 1,914,651, the individual pins have a pre-formed head flange at one end. To affix the pin to the base, the other end of the pin is inserted into an opening that extends through the base until its motion is stopped by the head. When this occurs the other end of the pin and a portion of the pin body extends outwardly from the base member. Thereafter, a circumferential bead is forged in the outwardly extended portion of the pin to affix the pin to the base member between the head and the bead. In certain of the embodiments of No. 1,936,,404, the bead is preformed and molded in the base or may be staked. No. 1,914,651 describes a prior art device in which after the hollow pin with a preformed shoulder is pushed into place the end of the pin is spun over to hold the pin in the opening of the base.

The pins of No. 2,292,863 have a preformed flange and the pins are affixed to a metallic header by a fusible vitreous material sealant, e.g. glass, which seals the flange to the header, a portion of the pin above the flange passing through an opening in the header for this purpose.

The pins of the switch device of No. 3,211,875 are affixed between their flanges and their upper ends, which are spun or flanged over, to a thermo-setting phenolic plastic base member.

The connector of No. 3,670,294, has a portion of the pins thereof formed with an X shaped cross section, the arms of which extend from a center rectangular section. The tips of the wings engage the corners of a rectangular cross section opening in an insulator block so as to affix the pins to the block.

The pins of No. 4,753,602 are initially affixed to their housing by providing the pin receiving openings of the housing member with cross sectional configurations compatible with the cross section configurations of the portions of the pins located within the openings. As the lower ends of the pins are inserted into the openings of a printed circuit board, the cross sectional portions move into other passages with larger cross sections so as to be free to move laterally in the housing.

A hollow swaged pin has an enlarged portion which abuts the shoulder of an inner passage of a plastic socket in the device of the aforementioned publication in the IBM Technical Disclosure Bulletin, July 1986, pp 639-640, and thus prevents the pin from being pulled through the bottom of the socket by the disengagement of the plug which mates with the pin.

The metal stem of No. 4,136,259 is held in place in the bore of a ceramic body by projections or teeth formed in the bore which grip the stem.

Affixing pins to a printed circuit board has been done in diverse ways and for diverse reasons. Thus, in No. 2,846,659, a hollow soldering terminal (i.e. a non-pluggable pin) is affixed to a printed circuit board by forming cup shaped expanded portions in the outwardly extending portions of a tubular blank which extends on opposite sides from an opening in a printed circuit board.

A terminal post is affixed to a printed circuit board in No. 2,290,533 by providing a serrated portion of it which when inserted into the opening of the printed circuit board bites into the conductive material in the hole. The serrated portion has a tapered conical cross section which is compatible to a countersunk recess of an opening in the board in which it is disposed and an extended hollow portion which extends through the rest of the opening and outwardly therefrom, the latter being peened over to make contact with the circuitry on the side of the board from which it extends.

In No. 3,093,887, inserts with pins extending therefrom have a preformed flange and a knurled portion below the flange, and the pins become affixed by the knurled section to the board when inserted into the opening of a printed circuit board.

A weldable pin with a pre-formed flange is affixed to a printed circuit board in No. 3,202,755 by inserting the splined lower portion into the opening of the board to cut into its conductive plating and peening over the end of the splined portion.

An interface pin blank is affixed within the opening of a printed circuit board by compressing it at both ends so that it radially expands within the opening in No. 3,484,937.

A length of wire is provided with a cutting edge so that it cuts out a portion of a printed circuit board and extends on both sides of the board where it is subsequently soldered to the concentric lands on both sides of the board and thus is held in place in No. 3,494,029.

A pin blank with a ferrule which extends outwardly on both sides of a printed circuit board from a hole therein is secured to the board by forming outwardly bowed collars on the ends of the ferrule in No. 3,601,750.

In Australian Patent, No. 247,445, a soldering terminal is affixed to an insulating base by forming expanded stops in a wire which passes through the base.

In Canadian Patent, No. 891,180, and the IBM Technical Disclosure Bulletin, Vol. 9, No. 4, September 1966, p 365, the pins are affixed to a printed circuit board by projecting them at high velocity into and/or partially thru the board.

Affixing pins, and in particular pluggable pins, to a ceramic substrate has been a major concern in the prior art because of the frangible and brittle nature of ceramic materials and their tendency to crack or chip especially in the vicinity of the pin holes when subjected to the stresses involved with affixing the pins.

In U.S. Pat. Nos. 3,216,097, 3,257,708, 3,768,134 and the IBM Technical Disclosure Bulletin, Vol. 14, No. 9, February 1972, p 2594, blank pins are fed into the holes of a ceramic substrate and in sequential operational steps a head and a bulge are formed in the pin blank to affix the pin to the substrate. In U.S. Pat. Nos. 3,216 097 and 3,768,134, a flush mounted resilient block centrally is located in a nest formed in a die plate which supports the ceramic substrate. The die plate has peripheral guide holes located around the nest which receive the pin blanks that extend from the aligned holes of the substrate. When the pin blanks are forced into the openings of the substrate a spring biased rubber tipped finger resiliently presses the central portion of the substrate down on the resilient block holding it firmly to prevent fracture.

In U.S. Pat. No. 3,489,879, a pin with a preformed shoulder is inserted into a opening of a ceramic substrate up to the shoulder. After the insertion, a head is formed on the end of the blank using a thermoswaging method which employs pressure and heat, followed by a cooling step, which leaves the portion of the pin between the head and the shoulder in tension and thereby affixing the pin to the ceramic.

In another device, nearly flush pin blanks are inserted into an elongated slot formed in a ceramic substrate and then compressed at its slightly protruding ends so as to expand radially in the slot and become affixed to the ceramic substrate as disclosed in U.S. Pat. No. 3,529,120. Another pin is inserted in the open side of the slot orthogonal to the first mentioned pin with its end abutted and welded to the side of the first pin.

The pin blanks of U.S. Pat. No. 3,735,466 are inserted in the openings of a ceramic substrate and extend into the guide holes or cavities of individual bushings. Next, formation of the pin heads by a ram occurs. The regions surrounding the holes of the ceramic substrate are supported by the end faces of the bushings facing the ceramic substrate, and the bushings in turn are supported on a resilient pad thus reducing cracking in the substrate in the vicinity of the holes during the head forming operation.

Typical electronic circuit packages employing pinned ceramic substrates are described in U.S. Pat. Nos. 4,082,394 and 4,092,697. The pin of U.S. Pat. No. 4,082,394 is illustrated as having a flange and headless, and the pin of U.S. Pat. No. 4,092,697 is illustrated as being headless and flangeless.

The pin blank of U.S. Pat. No. 4,110,904 has a preformed flange which is inserted into an opening of a ceramic substrate up to the flange. Thereafter, a head is formed by a ram in the inserted end of the pin blank.

In U.S. Pat. No. 4,598,470, the ends of pin blanks are inserted into circular apertures of ceramic green sheets. When sintered the apertures shrink to an elliptical cross section and the inserted pins expand to a compatible configuration and results in the affixing of the pin to the sintered substrate.

In IBM Technical Disclosure Bulletin, Vol. 14, No. 1, June 1971, pp 174–175, the ends of pins are inserted into the openings of a pressed unfired ceramic, and the remainder of the pin is inserted in an opening of a graphite mold fixture. A subsequent firing cycle cures the ceramic and the pins assume the shape of the respective openings of the ceramic substrate and mold, which is subsequently removed, leaving the pins affixed to the substrate.

In the impact pinners of U.S. Pat. Nos. 4,415,113 and 4,631,821, the pin blanks are inserted in the openings of a ceramic substrate and impacted simultaneously at both ends to place the blank in a temporary viscoelastic state which causes a resultant metal flow in each pin that penetrates the ceramic particles in the wall of the opening. Upon return to its solid state, the metal flow remains interlocked with the ceramic particles, thus affixing the pin to the substrate.

The pin blanks of IBM Technical Disclosure Bulletin, Vol. 22, No. 8B, January 1980, pp 3649–3650 are inserted in the openings of a ceramic substrate and extend into segmented floating anvils. Next, formation of the pin heads by segmented floating rams occurs. The ceramic substrate is supported on the anvils, and both the anvils and rams are supported on fluid filled bladders. As a result, bending stresses are mitigated during the formation of the pin head.

However, the cracking of ceramic substrates during pinning, i.e. affixing pins to the ceramic substrate, still plagues the industry and with the advent of higher pin counts, greater pin densities, and/or further miniaturization of the pin diameters and sizes, the problem is compounded even further. Part of the problem is that the substrate even when precision made is subject to have some inherent degree of surface irregularity such as warpage and the like which creates stresses in the ceramic during the pinning causing it to crack. While the prior art such as, for example, the cushioning pads of U.S. Pat. Nos. 3,216,097 and 3,215,708, or the individual bushings and resilient pad of U.S. Pat. No. 3,735,466, or the individual rams and anvils and fluid filled bladders of the aforementioned Modlo et al publication, are directed to the relief of the stress during pinning caused by the inherent surface irregularity of the ceramic substrate, they are still inadequate, cumbersome, complex and/or expensive for the needs of today's high density, high pin counts and/or miniaturization requirements.

SUMMARY OF THE INVENTION

An object of this invention is to provide an improved method for affixing pins to a ceramic substrate.

Another object of this invention is to provide an improved method for affixing pins to a ceramic substrate that substantially mitigates cracking of the substrate.

Another object of this invention is to provide a method of the aforementioned kind that provides an improved yield and highly reliable pinned substrate.

Still another object of this invention is to provide a method of the aforementioned kind for manufacturing ceramic substrates having pluggable pins.

Still another object of this invention is to provide a method of the aforementioned kind which is particularly useful for the manufacture of pinned ceramic substrates with high density and/or high pin count and/or microminiature pins.

Other objects of this invention are to provide a method of the aforementioned kind which is not cumbersome to implement, is simple and/or is inexpensive.

According to one aspect of the invention, plural pins are affixed to a ceramic member, as follows. The opposite first and second ends of a plurality of elongated pin blank members are inserted in pin blank receiving first and second cavities, respectively, of first and second die blocks, respectively. The inserted first and second ends of the pin blank members are placed in contact with first and second pin rods, respectively, that are disposed in the first and second cavities, respectively, so as to provide a predetermined space between the first and second blocks which will have an intermediate portion of each of the pin blank members within the space. At least the first pin rods are adjustably positionable within the first cavities.

Next, the first and second die blocks are moved relatively towards each other to decrease the space and to thereby form radial first expansions of the aforementioned intermediate portions within the decreased space between said first and second die blocks.

Next, the second die block is retracted to remove the elongated members from said second cavities.

Thereafter, the pin blank members are inserted from their second ends into openings therethrough of a ceramic planar member so as to extend the second ends outwardly from the openings on one side of the ceramic member and to place the radial first expansions in contact with the ceramic member on the opposite side thereof.

The first pin rods are adjusted in the first cavities to provide a predetermined clearance between the first die block and the first expansions, while contact of the first ends with the pin rods is maintained.

A pin head forming surface of a third die block is juxtaposed adjacent to the second ends, and the first and third die blocks are moved relative towards each other to form a pin head at each of the second ends that is in contact with the aforementioned one side of the ceramic member and a radial second expansion in each of the pin members between their respective second ends and their respective first expansions thereof and such that the second expansion contacts the ceramic member within the respective opening that the particular pin is expanded, the pin members being thus affixed to the ceramic member between the first radial expansions and the heads thereof.

Thereafter, the first and third die blocks are retracted away from the ceramic member and the pin members which are affixed thereto.

The foregoing and other objects, features and advantages of the invention will be apparent from the more particular description of the preferred embodiment of the invention, as illustrated in the accompanying drawing.

BRIEF DESCRIPTION OF THE DRAWING

FIG. 1 is a schematic partial top view of a ceramic substrate pinned in accordance with the preferred embodiment of the present invention;

FIG. 2 is a schematic cross sectional view of the pinned ceramic substrate of FIG. 1 taken along the line 2—2 thereof; and FIGS. 3-9 are schematic partial cross sectional views illustrating the preferred embodiment for pinning a ceramic substrate in accordance with the principles of the present invention.

In the figures, like elements are designated with similar reference numbers.

DESCRIPTION OF THE PREFERRED EMBODIMENT

Referring to FIGS. 1-2, there is shown a ceramic substrate 1 which has an arrangement of plural pins 2 affixed to it by the preferred embodiment of the present invention, as herein after described. The pins 2 are preferably arranged in a rectangular coordinate array of vertical columns, C1, C2, C3, etc, and horizontal rows R1, R2, R3, etc. Moreover, in the preferred array, the pins 2 in any given column (e.g. column C2) and in any given row (e.g. row R2) are offset or staggered with respect to the pins 2 of the adjacent thereto column/s (e.g. columns C1 and C3) and row/s (rows R1 and R3), respectfully; and, furthermore, the pins 2 in any given column (e.g column C1) and in any given row (e.g. row R1) are in alignment with the corresponding pins 2 of the alternate, that is to say every other, columns (e.g. columns C3, C5, etc.) and rows (e.g. row R3, R5, not shown, etc.), respectfully; cf. FIG. 1. Such an arrangement is referred to in the art as an interstitial array. In the illustrated arrangement, the spacing 2A between alternate columns and between alternate rows are equal, and the spacing A between adjacent columns and between adjacent rows are equal, the spacing A being one half of the spacing 2A. Hence, the spacing of a pin 2 with respect to any adjacent pin 2 in the adjacent next column or adjacent next row is 1.41×A for the given relationships.

Ceramic substrate 1 has a rectangular configuration, partially shown in FIG. 1, and has upper and lower planar sides or surfaces 1A and 1B, respectively. Extending through the ceramic substrate 1 are plural openings 3 in each of which is affixed a portion 4 of one of the elongated pins 2 between the bulge 5 and head 6 integrally formed thereon in accordance with the principles of the present invention. The pins 2 have lower portions 7, i.e. a male member portions, which are adapted to plug into mating sockets, not shown, such as the plated thru holes of a printed circuit board or the like. The surface 1A of substrate 1 is circuitized with a circuit pattern which includes a plurality of circuit conductors 8 that are connected to the conductive lands 9, which are also part of the circuit pattern and surround the openings 3. The conductors 8 are connected to and fan out from input/output pads, not shown, which are also part of the circuit pattern, and are located inwardly on the surface 1A. The pads, not shown, are adapted to be connected to the input/output terminals, not shown, of an integrated circuit chip, not shown, subsequently connected and mounted thereto in a manner well known to those skilled in the art, such as, for example, by a controlled collapse chip connection (C4) solder bond or the like. The heads 6 of the pins 2 are electrically connected to the lands 9 by direct contact therewith and, if desired, the electrical connection may be enhanced by a solder bond.

Referring now to FIGS. 3-9, the preferred embodiment for affixing the pins 2 to a ceramic substrate in accordance with the principles of the present invention will next be described. For sake of simplicity and clarity, the invention will be described herein with reference to a single illustrated pin. It should be understood, however, that all the pins to be affixed to the substrate are processed at the same time during each of the method steps being described.

Thus, in FIG. 3, it should be understood that the partially shown die block 10 has plural pin blank receiving cavities 11, only one of which is partially shown for sake of clarity. The cavities 11 of block 10 have an arrangement in the block 10 identical to the desired arrangement for the pins 2 to be ultimately affixed to the ceramic substrate. The cavities 11 extend through the block 10 from the latter's surface 10A to its opposite surface, not shown. Each of the cavities 11 has an adjustably positionable elongated pin rod 12 with an upper end 13 and an opposite lower end, not shown, that are proximate and remote, respectively, to the surface 10A. The rods 12 extend outwardly from the aforementioned opposite surface, not shown, of block 10 and at their other ends, not shown, are in contact with an external punch plate, not shown, or the like. The punch plate is positionable in a bidirectional manner indicated by the arrow B in FIG. 4 and thus in turn positions the rods 12 to a predetermined depth D1 from the surface 10A which is correlated with the desired length LM, cf. FIG. 9, of the male portions 7 of the pins 2 to be ultimately formed.

Plural elongated conductive pin blank members 2' are inserted in mutually exclusive ones of the cavities 11, i.e. each cavity 11 receives a single blank member 2', the bore of the cavity 11 being judiciously selected to guide and hold the blank 2' in a substantially upright, i.e. vertical position as viewed facing FIG. 3. The ends 2L of blank members 2', when fully inserted, are in contact with and supported by the respective proximate ends 13 of the rods 12, the ends 13 acting as stops for the blank members 2'. The pin blank members 2' have a uniform length L and preferably have solid cylindrical configurations with uniform circular cross sections, with the ends 2L and 2U thereof being in the form of snub nose or round like configurations.

In a manner similar to that of die block 10, a second die block 20, partially shown in FIG. 4, has plural pin blank receiving cavities 21, only one of which is partially shown for sake of clarity. The cavities 21 of block 20 have an arrangement in the block 20 which is identical to the arrangement of the cavities 11 of block 10, and, hence, is also identical to the desired arrangement for the pins 2 to be ultimately affixed to the ceramic substrate. The cavities 21 extend through the block 20 from the latter's surface 20A to its opposite surface, not shown. Each of the cavities 21 has an adjustably positionable elongated rod 22 with an end 23 and opposite end, not shown, that are proximate and remote, respectfully, with respect to the surface 20A. The rods 22 extend outwardly from the aforementioned opposite surface, not shown, of block 20 and are in contact at their remote ends, not shown, with another punch plate, not shown. The end of the rods 22 are set to a predetermined depth D2 from the surface 20A of die block 20 which is correlated with the thickness T, cf. FIG. 7, of the substrate and length L1, cf. FIG. 7, of the portion of the pin member 2' required for the subsequent head forming operation, which follows the bulge forming operation as hereinafter described.

With the members 2' inserted and their ends 2L and 2U in contact with the ends 13 and 23, respectively, of rods 12 and 22, respectively, and the latter positioned at the depths D1 and D2, respectively, a predetermined space of width S1 between the first and second blocks 10 and 20 at their respective surfaces 10A and 20A is provided in which an intermediate portion 15 of each of the pin blank members 2' is disposed, as shown in FIG. 4.

Referring now to FIG. 5, next, the two die blocks 10 and 20 are moved relatively towards each other to decrease the width S1, cf. FIG. 4, of the space between them to the width S2. As a result, the aforementioned intermediate portions 15 expand radially within the decreased space between the die blocks 10 and 20, thus forming the bulges 5 in the pin blank members 2'.

Next, the die block 20 is retracted in the direction indicated by the arrow C, cf. FIG. 6, to remove the pin blank members 2' from its cavities 21. To enhance removal of the pin blank members 2' from the cavities 21 and to insure maintenance of the contact between the ends 2L of the blank members 2' and the ends 13 of the rods 12 of block 10 during the last mentioned removal, the ends 23 of rods 22 are maintained in contact with the ends 2U of members 2' while the die block 20 is being retracted. More particularly, the rods 22 are held by the aforementioned punch plate, not shown, which is associated with the block 20, until the ends 23 clear the surface 20A of the die block 20, as shown in FIG. 6. This is particularly useful, especially, if there has been any radial expansion of the blank members 2' within the cavities 21 resulting from the bulge forming step that would otherwise tend to inhibit the removal of the pin blank members 2' from the cavities 21 during the subsequent retraction of the block 20. As a result, the pin blank members 2' remain properly positioned in the cavities 11 of die block 10, that is to say with their ends 2L in contact with the ends 13 of the rods 12, which are still set in the the position, i.e. depth D1, as previously explained.

Next, the pin blank members 2', while still properly positioned in the cavities 11, are inserted from their ends 2U into the openings 3 of a ceramic planar substrate 1, the arrangement of the holes 3, as aforementioned, being identical to the arrangement of the pin blank members 2' and cavities 11 of block 10. As a result, the second ends 2U, as shown in FIG. 7, extend outwardly through the openings 3 from the side, i.e. circuitized surface 1A, of substrate 1 a length and the bulges 5 are in contact with the opposite side 1B of substrate 1, as shown in FIG. 7.

The rods 12 are adjusted in the cavities 11 by the aforementioned punch plate, not shown, associated with the die block 10 to provide a predetermined clearance E, cf. FIG. 7, between the surface 10A of the first die block and bulges 5, and to maintain contact of the ends 2L with the ends 13 of the rods 12. More particularly, the last mentioned punch plate is elevated causing the rods 12 in response thereto to be elevated and they in turn to lift the now bulged pin blank members 2' so as to provide the desired clearance E. The clearance E is judiciously selected to compensate for any surface irregularities, such as warpage, that may be present in the ceramic substrate, and yet at the same time does not allow any appreciable radial expansion of the pin blank member 2' in the clearance E during the subsequent formation of the pin head 6 in blank member 2'.

A third die block 30, partially shown in outline form in FIG. 7 with a pin head forming surface 30A is juxtaposed adjacent and placed in contact with the ends 2U of the blank members 2'. In the embodiment being described, the surface 30A is flat. With the ends 2U in contact with the surface 30A, a space with a width S3 is provided between the die block 10 and ceramic substrate 1 at their surfaces 10A and 1B, respectively, which substantially includes the clearance E and the bulge 5, and a space with a width substantially equal to the length L1 is provided between the surface 30A of block 30 and the ends 2U of the members 2'.

Thereafter, the two die blocks 10 and 30 are moved relative towards each diminishing the spacing to a width S4 between the surface 30A and surface 1A, thereby forming a pin head 6 at each of the ends 2U that is in contact with the circuitized surface 1A, i.e. the land 9 thereof, of the ceramic substrate. Concurrently forming therewith is a radial second expansion in each of the pin blank members 2' between their respective ends 2U and their respective previous first expansions, i.e. bulges 5, i.e. the portions 4 of the members 2' coextensive with the openings 3 . These last mentioned second radial expansions are placed in tight contact with the ceramic substrate 1 within its associated respective opening 11, i.e. in contact with the wall of the opening 11. As a result, the formation of the pins 2 is completed and the pins 2 are affixed to the ceramic substrate 1 between the bulges 5 and the heads 6 thereof, cf. FIG. 8, the heights or lengths of the head 6, bulge 5 and male portion 7 being designated in FIG. 9 by the reference characters, LH, LB, and LM, respectively. Concurrently, with the head formation operation, the spacing between the surface 10A and and surface 1B decreases from a width of S3 to a width S5 causing the bulges 5 to contact surface 10A. It should be understood that in the Figures, the clearance E is illustrated greatly exaggerated for sake of clarity. In practice, the clearance E is such that the height LB of the bulges 6 before and after the head forming operation remains substantially the same. Preferably, the die 10 is held stationary and the die 30 moves toward the die 10 during the head forming operation.

Thereafter, the die blocks 10 and 30 are retracted away from the ceramic substrate 1 and the affixed pins 2. To enhance removal of the pins 2 from the cavities 11, the rods 12 are moved in the direction, cf. arrow F, FIG. 9, (while the die 10 is being relatively retracted in the opposite direction) by their aforementioned associated punch plate, not shown, until the ends 13 clear the surface 10A of the die block 10, as shown in FIG. 9. This is particularly useful, especially, if there has been any radial expansion of the pins 2 within the cavity 11 resulting from the bulge forming and/or head forming steps that would tend to inhibit the removal of the pins 2 during the subsequent retraction of the block 10.

It should be noted that in practicing the present invention, contact with the ceramic substrate 1 during any of the aforedescribed formation steps has been substantially eliminated thereby reducing the potential of stress and any adverse effects therefrom especially cracking in general and micro-cracking around the openings 3 in particular. Moreover, the bulge forming operation, which generally requires a greater force than the force required for the head forming operation, is done external to the ceramic substrate 1, and the head forming operation is done with the aforementioned clearance E to reduce the stresses in the substrate 1 and especially in the vicinity of the openings 3 thereof, resulting in a highly reliable pinned substrate and low cost and simple pinning method. The method is particularly useful for affixing high density/high count microminiature conductive pins to circuitized ceramic substrates, and/or is highly independent of variations on pin lot and substrate lot characteristics.

In Table I below, are typical nominal parameters associated with the pinning of certain ceramic substrates with an interstitial array of conductive metal pins using the preferred method of this invention. The pin blanks were made from solid wire stock of a copper zirconium composition; and the ceramic substrates had a composition of aluminum oxide.

TABLE I

| | |
|---|---|
| Pin Count | 304 |
| Substrate: | |
| Length | 1.42 in. |
| Width | 1.42 in. |
| Thickness T | 0.060 in. |
| Spacing A | 0.050 in. |
| Diameter, Opening 3 | 0.018 in. |
| Pin Blanks 2': | |
| Length L | 0.330 in. |
| Length L1 | 0.030 in. |
| Diameter | 0.0159 in. |
| Die Block 10: | |
| Diameter, Cavity 11 | 0.0165 in. |
| Diameter, Rod 12 | 0.0160 in. |
| Depth D1 | 0.187 in. |
| Die Block 20: | |
| Diameter, Cavity 21 | 0.0165 in. |
| Diameter Rod 22 | 0.0160 in. |
| Depth D2 | 0.094 in. |
| Spacings: | |
| S1 Width | 0.049 in. |
| S2 Width | 0.010 in. |
| S3 Width | 0.012 in. |
| S4 Width | 0.010 in. |
| S5 Width | 0.010 in. |
| Clearance E | 0.002 in. |
| Finished Pin: | |
| LH Height, Head 6 | 0.010 in. |
| LB Height, Bulge 5 | 0.010 in. |
| LM Length, Male Portion 7 | 0.187 in. |
| Diameter, Male Portion 7 | 0.0165 in. |
| Diameter, Portion 4 | 0.018 in. |
| Bulge Forming Operation: | |
| Force | 7800 lbs. |
| Die stroke rate | 0.1 in/min |
| Number of Strokes | 1 |
| Head Forming Operation: | |
| Force | 7200 lbs. |
| Die stroke rate | 0.1 in/min |
| Number of Strokes | 1 |
| Yield: | 100% |

It should be understood that while the invention is described using symmetrical arrangements and more particularly a rectangular interstitial (staggered) pin arrays, the invention can be modified for use with regular rectangular or other coordinate arrays, as well as asymmetrical arrangements. Moreover, while the invention is described wherein preferably the lower die 10 is maintained stationary and the other dies 20 and 30 are advanced towards it during the bulging and head forming operation, respectively, it should be understood that the other dies 20 or 30 may be held stationary and the die 10 advanced toward die 20 or 30 during the bulging and heading operations, or dies 10 and 20 can both move towards each other during the bulge forming operation and/or dies 10 and 30 can both move towards each other during the head forming operation, and/or any combination of the foregoing.

It should also be understood, that preferably the pins 12 are elevated to provide the clearance E for the bulges 5 after the ceramic member 1 has been placed in contact with the bulges 5. However, if desired, the pins 12 may be elevated before contact between the ceramic member 1 and the bulges 5 is made or before the member 1 is placed on the pin members 2'.

Furthermore, if desired, the method can be used to affix flush headed pins to a ceramic substrate. In such applications, the openings of the substrate would be precountersunk at the circuitized surface of the substrate and the head forming face of the head forming die block would be modified to have plural outwardly extending head forming protrusions in alignment and contact with the ends of the pin blank members from which the heads are to be formed.

Thus, while the invention has been described with reference to a preferred embodiments thereof, it will be understood by those skilled in the art that various changes in form and detail may be made without departing from the scope of the invention.

We claim:

1. A method for affixing plural pins to a ceramic member, said method comprising the steps of:
   inserting the opposite first and second ends of a plurality of elongated pin blank members in pin blank receiving first and second cavities, respectively, of first and second die blocks, respectively,
   placing said inserted first and second ends of said pin blank members in contact with first and second end means, respectively, of first and second pin rods, respectively, disposed in said first and second cavities, respectively, to provide a predetermined space between said first and second blocks having an intermediate portion of each of said pin blank members within said space, at least said first pin rods being adjustably positionable within said first cavities,
   relatively moving said first and second die blocks towards each other to decrease said space and to thereby form radial first expansions of said intermediate portions within the decreased said space between said first and second die blocks, retracting said second die block to remove said elongated members from said second cavities, inserting said pin blank members from said second ends into openings therethrough of a ceramic planar member to extend said second ends outwardly from said openings on one side of said ceramic member and to place said radial first expansions in contact with said ceramic member on the opposite side thereof,
   adjusting said first pin rods in said first cavities to provide a predetermined clearance between said first die block and said first expansions and maintaining contact of said first ends with said first end means of said first pin rods,
   juxtaposing a pin head forming surface of a third die block adjacent to said second ends, and relatively moving said first and third die blocks towards each other to form a pin head at each of said second ends in contact with said one side of said ceramic member and a radial second expansion in each of said pin members between said second ends and said first expansions thereof to contact said ceramic member within said openings, said pin members being thereby affixed to said ceramic member between said first radial expansions and said heads thereof, and thereafter retracting said first and third die blocks away from said ceramic member and said pin members affixed thereto.

2. The method according to claim 1 further comprising the step of maintaining said first end means of said first pin rods in contact with said first ends of said pin blank members during said retracting of said first and third die blocks.

3. The method according to claim 1 further comprising the step of maintaining said second end means of said second pin rods in contact with said second ends of said pin blank members during said retracting of said first and second die blocks.

4. A method for affixing plural pins to a ceramic member, said method comprising the steps of:
   providing a plurality of elongated conductive metal pin blank members, each of said pin blank members having first and second ends,
   providing a first die block having a plurality of pin blank receiving first cavities inwardly disposed from a common first surface of said first block in a predetermined first arrangement, each of said first cavities having disposed therein a first pin rod slidingly adjustable therein, each of said first pin rods having a first proximate end and a first remote end, respectively, relative to said common first surface,
   positioning said first pin rods within said first cavities to provide said first proximate ends a predetermined first distance below said common first surface,
   inserting said pin blank members from said first ends thereof in mutually exclusive ones of said pin blank receiving first cavities to place said first ends of said blank members in contact with said first proximate ends of said first pin rods disposed in said pin receiving first cavities,
   each of said pin blank members having a protrusion terminating in said second end thereof and extending outwardly from said common first surface a predetermined second distance when said first end thereof is in said contact with the particular one of said first proximate ends and said first pin rods are positioned at said first predetermined distance,
   providing a second die block having a plurality of pin blank receiving second cavities inwardly disposed from a common second surface of said second block, said second cavities having a predetermined second arrangement substantially corresponding to said first arrangement, each of said second cavities having therein a slidingly adjustable second pin rod, said second pin rods having a second proximate end and a second remote end, respectively, relative to said common second surface,
   positioning said second pin rods within said second cavities to provide said second proximate ends a predetermined third distance below said common second surface,
   juxtaposing said first and second die blocks with said first and second common surfaces, respectively, in facing relationship and with each of said first cavities of said first arrangement being aligned with the corresponding one of said second cavities of said second arrangement,
   inserting said protrusions from said second ends thereof in mutually exclusive ones of said corresponding pin blank receiving second cavities to place said second ends in contact with said second proximate ends, providing a predetermined spacing between said common first and second surfaces when said first and second ends are in contact with said first and second proximate ends, respectively, and said first and second pin rods are positioned at said first and second distances, respectively, relatively moving said first and second die blocks towards each other to decrease said spacing and to form a radial first expansion of an intermediate portion of each of said protrusions within said spacing, retracting said second die block from said protrusions and said second ends, providing a ceramic planar member having first and second planar surfaces and plural openings extending therethrough in a third arrangement substantially corresponding to said first arrangement, inserting said protrusions from said second ends into said openings of said ceramic member from said second planar surface thereof to extend outwardly from said openings at said first planar surface and to place said radial first expansions in contact with said second planar surface, positioning said first pin rods within said first cavities closer to and below said common first surface a predetermined fourth distance to elevate said first expansions with a predetermined clearance above said first common surface, providing a third die block having a pin head forming surface juxtaposed to and in contact with said second ends, relatively moving said first and third die blocks towards each other with said first and second ends in contact with said first and second proximate ends, respectively, and with said first pin rods at said predetermined fourth distance, to form a pin head at each of said second ends in contact with said first planar surface and provide radial second expansions of said protrusions to contact said ceramic member within said openings to thereby affix said pin members to said ceramic member between said radial first expansions and said heads thereof, and thereafter retracting said first and third die blocks away from said ceramic member and said pin members affixed thereto.

5. The method according to claim 4 further comprising the step of maintaining said first end means of said first pin rods in contact with said first ends of said pin blank members during said retracting of said first and third die blocks.

6. The method according to claim 4 further comprising the step of maintaining said second end means of said second pin rods in contact with said second ends of said pin blank members during said retracting of said first and second die blocks.

7. The method according to claim 4 wherein said pins are of the pluggable type.

* * * * *